(12) United States Patent
Irvine

(10) Patent No.: US 8,536,943 B2
(45) Date of Patent: Sep. 17, 2013

(54) SELECTIVE NARROWBAND FEEDBACK FOR A DIGITAL PREDISTORTER

(75) Inventor: Garrick Thomas Irvine, Ottawa (CA)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 13/365,782

(22) Filed: Feb. 3, 2012

(65) Prior Publication Data

US 2013/0200951 A1    Aug. 8, 2013

(51) Int. Cl.
H03F 1/26 (2006.01)
(52) U.S. Cl.
USPC ........... 330/149; 330/302; 330/126; 330/297; 330/296
(58) Field of Classification Search
USPC ......... 330/149, 302, 126, 297, 296; 455/126; 375/297, 296
See application file for complete search history.

(56) References Cited

U.S. PATENT DOCUMENTS

| | | | | |
|---|---|---|---|---|
| 5,959,499 A * | 9/1999 | Khan et al. | .................... | 330/149 |
| 7,113,551 B2 * | 9/2006 | Sills et al. | ..................... | 375/297 |
| 7,583,754 B2 * | 9/2009 | Liu | ................. | 375/297 |
| 7,773,692 B2 * | 8/2010 | Copeland et al. | ............. | 375/297 |
| 7,877,060 B1 * | 1/2011 | Khlat et al. | .................. | 455/63.1 |
| 8,019,015 B2 * | 9/2011 | Moffatt et al. | ................ | 375/297 |
| 8,294,605 B1 * | 10/2012 | Pagnanelli | .................... | 341/144 |
| 2008/0265996 A1 * | 10/2008 | Kim et al. | ..................... | 330/291 |

* cited by examiner

Primary Examiner — Patricia Nguyen
(74) Attorney, Agent, or Firm — Coats and Bennett, P.L.L.C.

(57) ABSTRACT

A method and apparatus is provided for linearizing the output of a non-linear device, such as a power amplifier. The input signal to the non-linear device is predistorted based on a predistortion model to compensate for distortion introduced by a non-linear device. A wideband feedback signal is generated from the output signal of the non-linear device, and the wideband feedback signal is filtered to generate two or more narrowband distortion signals with predetermined frequencies corresponding to anticipated distortion components in the output signal. Model parameters of the predistortion model are adapted based on the narrowband distortion signals.

24 Claims, 10 Drawing Sheets

SELECTIVE NARROWBAND FEEDBACK FOR A DIGITAL PREDISTORTER

BACKGROUND

The present invention relates generally to predistortion for non-linear devices and, more particularly, to methods and apparatus for providing selective narrowband feedback to an adaptation circuit for a digital predistorter.

The design of radio-frequency power amplifiers for communications applications often involves a trade-off between linearity and efficiency. Power amplifiers are typically most efficient when operated at or near the saturation point. However, the response of the amplifier at or near the point of saturation is non-linear, resulting in both phase and amplitude distortion. The non-linear response of a power amplifier causes out-of-band emissions and reduces the spectral efficiency in a communication system. In most communication systems, constraints are imposed on the non-linearity effects of the transmitted signal both within and outside the operational band.

One way to improve a power amplifier's linearity is to digitally predistort the input to the power amplifier to compensate for the distortion introduced by the power amplifier. In effect, the input signal to the power amplifier is intentionally distorted so that the added distortion, i.e. predistortion, cancels the distortion introduced by the power amplifier. Generally, the predistortion is applied to the signal digitally at baseband frequencies, i.e., before the signal is up-converted to radio frequencies. The appropriate distortion is determined by a non-linear distortion model that is updated based on feedback from the output of the power amplifier. To the extent that the predistorted power amplifier output results in net distortion, the non-linear model can be adjusted based on the feedback to reduce the net distortion at the output.

Non-linear distortion appearing near the operating band of interest can be modeled mathematically as a series of real-valued, odd-order terms of an AM-AM (amplitude modulation-amplitude modulation) response and an AM-PM (amplitude modulation-phase modulation) response which are due to amplitude-distortion and phase-distortion phenomena respectively. These two phenomena can also be described jointly using a complex gain response with complex coefficients for each term. This is referred to herein as the non-linear model. In the frequency domain, the odd-order terms produce distortion spectra with a bandwidth that is proportional to the order. For example, the 3rd-order distortion spectrum, which is due entirely to the 3rd order term, has a spectrum three times the bandwidth of the linear input spectrum. Similarly, the 5th order term has a spectrum five times the bandwidth of the linear input spectrum, and so forth. These spectral components superimpose to form the composite spectrum. Thus, by filtering one can isolate a band of distortion noise such that it is unrelated to the composite linear-term and $3^{rd}$-order term; isolate another band of distortion noise such that it is unrelated to the composite linear-term, $3^{rd}$-order and $5^{th}$-order terms, and so forth.

The magnitude of distortion caused by each term is linked to the non-linear model, and in general diminishes for higher-order terms. This factor has an important implication: for example filtering to select the $5^{th}$-order band with linear-term and $3^{rd}$-order distortion filtered out contains $5^{th}$, $7^{th}$, $9^{th}$ etc, however it is dominated by the $5^{th}$-order and hence can be used to estimate the $5^{th}$-order component of the non-linear model. Another implication is that very higher order terms become so low that they are insignificant. Significance is usually assessed in context of the constraints on the linearity of the transmitted signal both within and outside the operational band, where the former impair usability of the intended signal and the latter interfere with adjacent signals. The subset components of the non-linear model that are operatively processed are referred to herein as the predistortion model.

In order to properly update the predistortion model, the bandwidth of the feedback path must be large enough as to capture all distortion spectrum considered significant. In addition, the instantaneous dynamic range of the feedback signal must be large enough to represent both the largest magnitude components (linear term) and the lowest magnitude term of significance. In the sampled-domain where digital signal processing (DSP) is performed, a larger number of bits per sample (higher bit resolution) is required to represent a signal with larger instantaneous dynamic range. Total DSP resource loading is proportional to both bandwidth (sampling rate) and resolution (bits per sample). For some applications, the bandwidth and the instantaneous dynamic range of signals demand very high performance in the analog-to-digital-converter (ADC) and other DSP devices within the feedback path. The design criteria of power amplifiers is often driven by three principal opposing considerations: large desired operating bandwidth, stringent in-band linearity requirements associated with high-complexity modulation, and stringent out-of-band emissions regulatory requirements. The bandwidth and resolution requirements for the pre-distortion feedback path required to jointly fulfill these design criteria can be reduced by the present invention and thus can reduce the cost and complexity of predistortion circuits used in connection with power amplifiers.

SUMMARY

The present invention provides techniques for reducing the bandwidth and resolution requirements of components in the feedback path of a power amplifier circuit having a digital predistorter and adaptation circuit for adapting the predistorted based on feedback. A filter circuit is configured to isolate the distortion components in a wideband feedback signal and to generate narrowband distortion signals representing the distortion components of interest. The distortion signals can then be supplied to an adaptation circuit to adapt the predistortion model used by the predistorter. Although described in the context of a power amplifier circuit, the techniques are more generally applicable to other types of circuits with non-linear components, where it is desirable to linearize the output signal of the non-linear components.

Exemplary embodiments of the invention comprise methods for linearizing the output of a non-linear device. In one exemplary method an input signal to the non-linear device is based on a predistortion model to compensate for distortion introduced by the non-linear device. The non-linear device produces an output signal as a function of the predistorted input signal. A wideband feedback signal is generated from the output signal of the non-linear device. The wideband feedback signal is filtered to generate two or more narrowband distortion signals with predetermined frequencies corresponding to anticipated distortion components in the output signal. Model parameters of the predistortion model are adapted based on the narrowband distortion signals.

In some embodiments, the wideband feedback signal may be filtered by parallel filters in the feedback path. Alternatively, the wideband feedback signal may be filtered with a tunable filter in different time slots to produce different distortion signals in different time slots.

In some embodiments, resources for adapting model parameters of the predistortion model to different distortion signals may be allocated depending on an attribute of the corresponding distortion components, based on the order of the corresponding distortion components, or as a function of one or more of the distortion signals.

Other embodiments of the invention comprise a circuit including a non-linear device, a predistorter, a filter circuit, and an adaptation circuit. The non-linear device is configured to produce an output signal as a function of an input signal. The predistorter is configured to predistort the input signal to the non-linear device based on a predistortion model of the non-linear device to compensate for distortion introduced by the non-linear device. The filter circuit is configured to filter a wideband feedback signal derived from the output signal to generate two or more narrowband distortion signals with predetermined frequencies corresponding to anticipated distortion components in the output signal. The adaptation circuit is configured to adapt model parameters of the predistortion model based on the narrowband distortion signals.

The present invention reduces the bandwidth and resolution requirements of components in the feedback path. Additionally, the present invention reduces the amount of processing resources required to process the feedback.

Of course, the present invention is not limited to the above features and advantages. Indeed, those skilled in the art will recognize additional features and advantages upon reading the following detailed description, and upon viewing the accompanying drawings.

DETAILED DESCRIPTION

Figure 1:
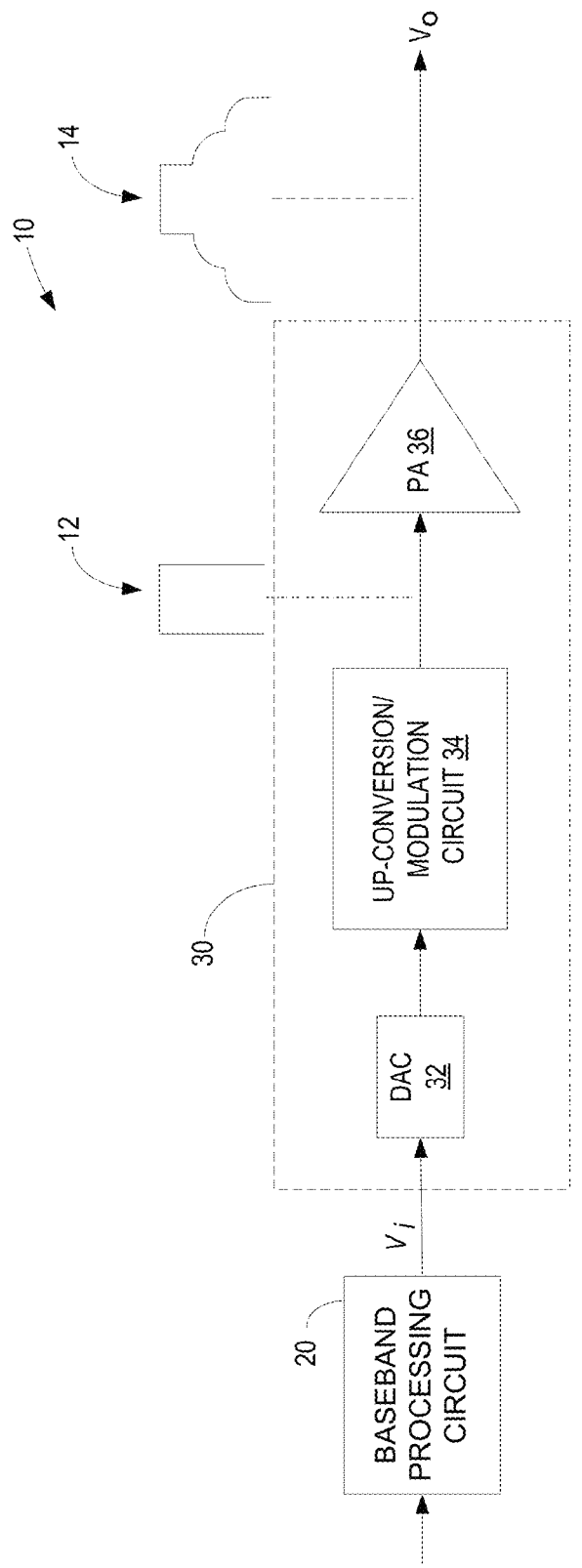
FIG. 1 illustrates an exemplary transmitter without predistortion.

Referring now to the drawings, FIG. 1 illustrates a transmitter 10 for a wireless communication device. The transmitter 10 comprises a baseband processing circuit 20 and transmit circuit 30. The baseband processing circuit 20 comprises one or more processors, hardware, firmware, or a combination thereof. The baseband processing circuit 20 generates an input signal $V_i$ to the transmit circuit 30.

The transmit circuit 30 comprises a digital-to-analog converter 32, up-conversion/modulation circuit 34, and power amplifier 36. The DAC 32 converts the input signal $V_i$ from digital form to analog form. The up-conversion/modulation circuit 34 up-converts the analog input signal and modulates the input signal onto a carrier. The modulated signal is then applied to the input of the power amplifier. As shown in FIG. 1, the modulated input signal has a linear spectrum at the input to the power amplifier 36 The power amplifier 36 amplifies the modulated input signal to generate an output signal for transmission. Because the power amplifier is a nonlinear device, the power amplifier 36 distorts the input signal. The output of the power amplifier therefore has a non-linear spectrum.

Figure 2:
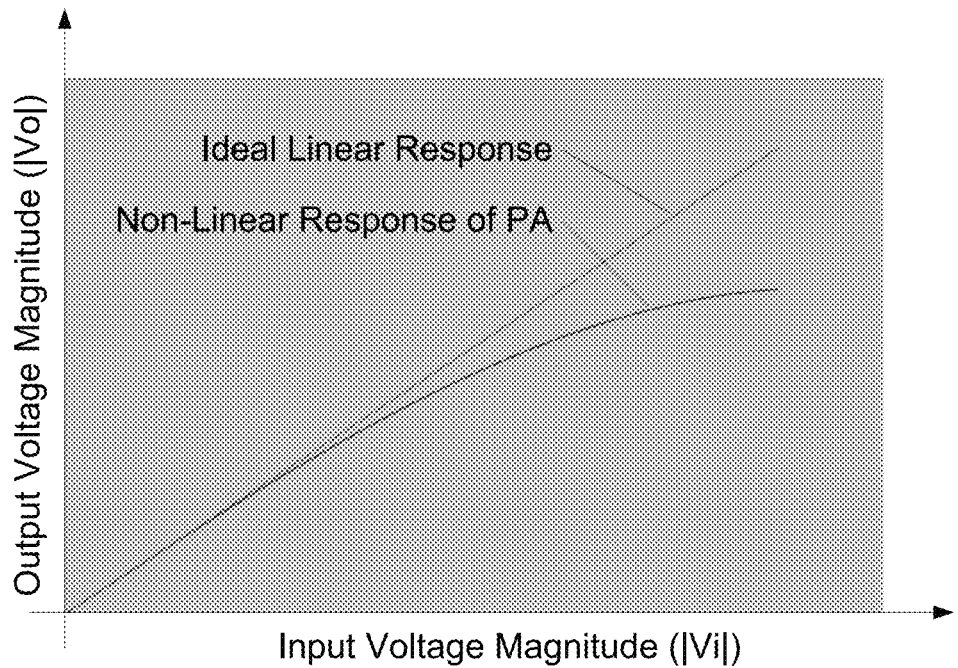
FIG. 2 illustrates amplitude distortion in a power amplifier for a transmitter without a predistorter.
Figure 3:
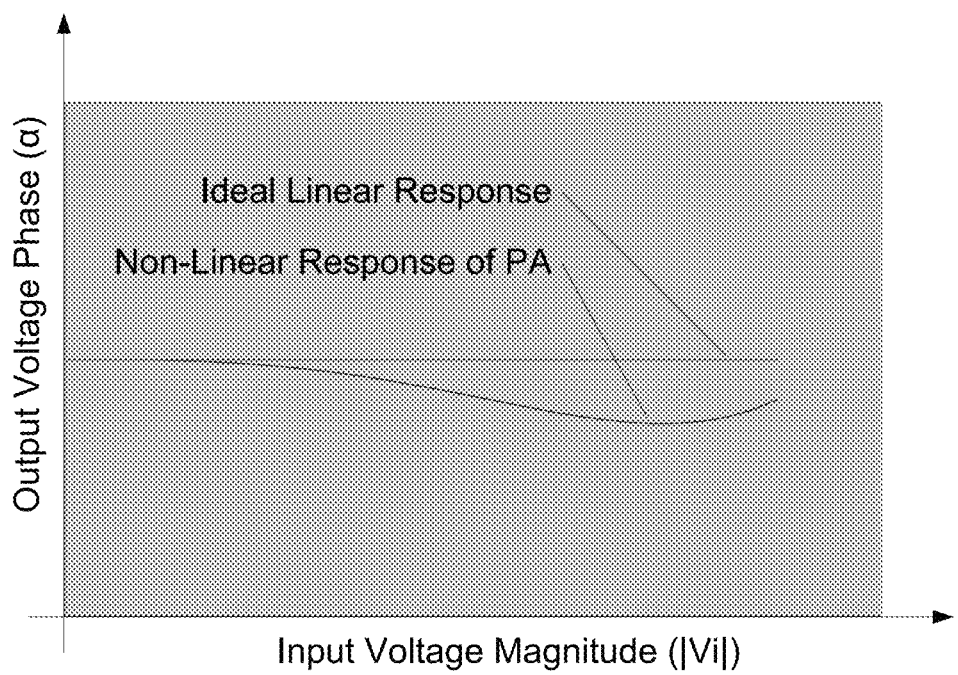
FIG. 3 illustrates phase distortion in a power amplifier for a transmitter without a predistorter.

FIGS. 2 and 3 illustrate the distortion introduced by the power amplifier 36. More particularly, FIG. 2 illustrates the amplitude distortion introduced by the power amplifier 36 as a function of the signal level. FIG. 3 illustrates the phase distortion of the power amplifier as a function of the signal level.

In exemplary embodiments of the present invention, the input signal to the power amplifier 36 is predistorted to linearize the output of the power amplifier 36, even while the power amplifier 36 is operated at high efficiency. The distortion introduced by the power amplifier 36 is modeled by a non-linear distortion function. The predistortion applied to the power amplifier input signal is the inverse of the power amplifier distortion function. Thus, the sequential predistortion and distortion by inverse functions results in a more linear output. Although predistortion is used herein to linearize the output of a power amplifier 36, those skilled in the art will appreciate that the techniques are more generally applicable to other types of nonlinear electronic devices.

Figure 4:
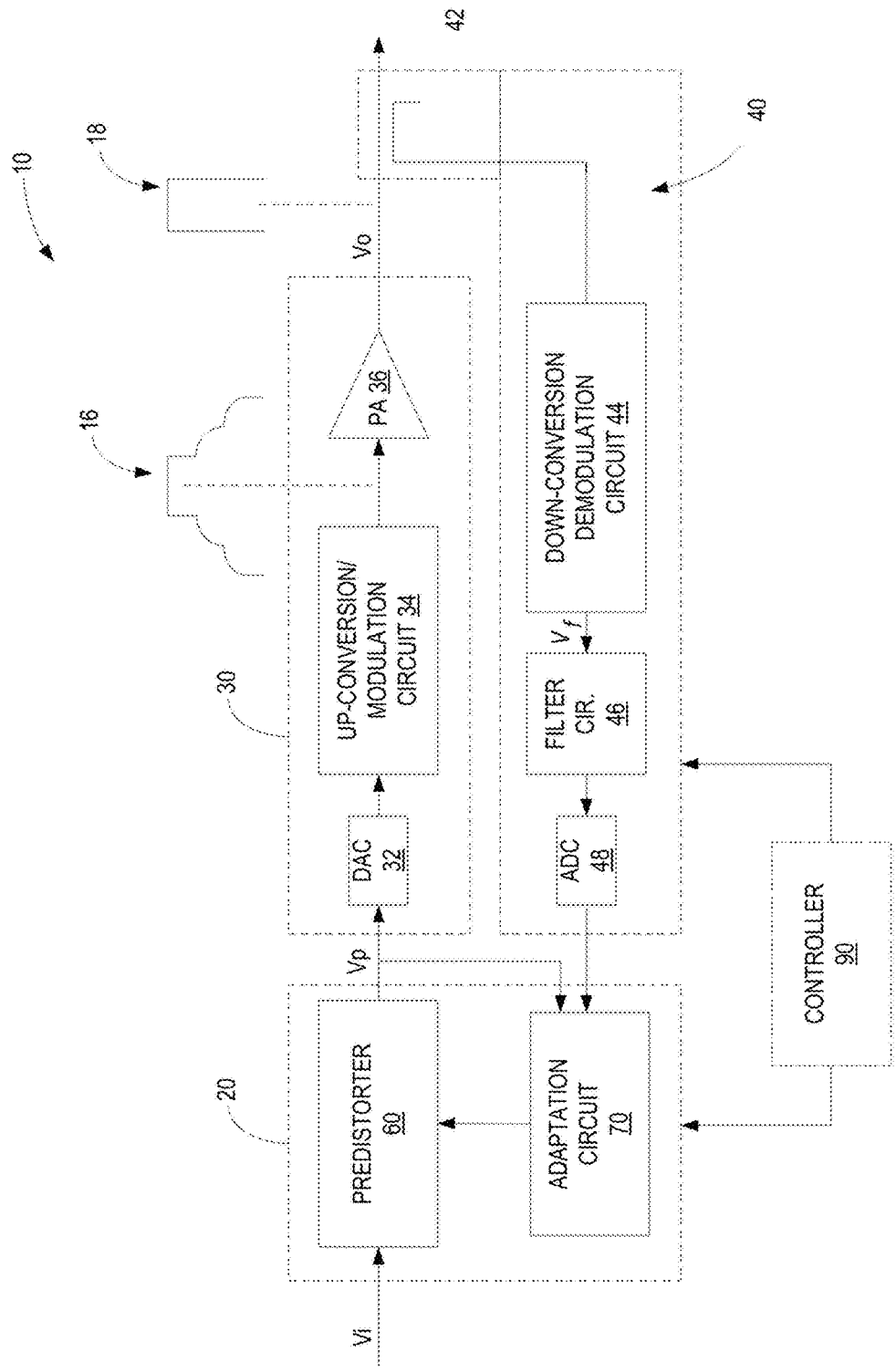
FIG. 4 illustrates an exemplary transmitter having a predistorter and selective feedback according to one exemplary embodiment.

FIG. 4 illustrates a transmitter 10 according to one exemplary embodiment including a predistorter to predistort the input signal $V_i$ to the power amplifier 36. The transmitter 10 comprises a baseband processing circuit 20, a transmit circuit 30, and a feedback circuit 40. Some embodiments of the invention may also include a controller 90 to control the feedback circuit 40 and baseband processing circuit 20 as hereinafter described.

The baseband processing circuit 20 includes a predistorter 60 and adaptation circuit 70. The predistorter 60 predistorts the input signal $V_i$ to compensate for the distortion introduced by power amplifier 36. The predistorter 60 applies a nonlinear transfer function that is based on a model of the power amplifier distortion as will be hereinafter described in greater detail. The predistorted signal, denoted $V_p$ is input to the transmit circuit 30. The adaptation circuit 70 adapts the transfer function used by the predistorter 60 to reduce or minimize the residual distortion in the power amplifier output signal. The operation of the adaptation circuit is described in more detail below.

The transmit circuit 30 comprises a digital-to-analog converter 32, up-conversion/modulation circuit 34, and power amplifier 36. The DAC 32 converts the predistorted signal $V_p$ from digital form to analog form. The up-conversion/modulation circuit 34 up-converts the analog predistorted signal and modulates the predistorted signal onto a carrier. After up-conversion and modulation, the predistorted signal is applied to the input of the power amplifier 36. At the input of the power amplifier 36, the spectrum of the predistorted signal is nonlinear. It may also be noted that the distortion introduced by the predistorter 60 expands the bandwidth of the input signal $V_i$.

The power amplifier 36 amplifies the predistorted signal to generate an output signal $V_o$. Assuming that the transfer function of the predistorter 60 cancels the distortion introduced by the power amplifier 36, the power amplifier output signal $V_o$ will have a linear spectrum. In practice, the transfer function applied by the predistorter 60 will not perfectly cancel the distortion introduced by the power amplifier 36. Accordingly, the output signal $V_o$ will have some residual distortion that has not been cancelled.

The feedback circuit 40 provides selective feedback derived from the output of the power amplifier 36 to the adaptation circuit 70. The feedback circuit 40 includes a coupler 42, down-conversion/demodulation circuit 44, filter circuit 46, and analog-to-digital converter 48. The coupler 42 generates a scaled version of the power amplifier output signal $V_o$. The down-conversion/demodulation signal down-converts and demodulates the scaled output signal to generate a baseband wideband feedback signal $V_f$. The feedback signal $V_f$ is selectively filtered by the filter circuit 46 to remove frequency components outside the band of interest. After filtering, the analog-to-digital converter 48 converts the feedback signal from analog to digital form for input to the baseband processing circuit 20. The feedback signal contains residual distortion components in the power amplifier output signal $V_o$.

In order to adapt the transfer function of the predistorter 60, the bandwidth of the feedback circuit 40 must be sufficiently wide to capture all distortion spectrum considered significant. In many applications, the bandwidth and dynamic range of signals require very high performance in the analog-to-digital converter 48. Further, the processing resources for the adaptation circuit 70 must be scaled, depending on the bandwidth of the feedback signal. Therefore, it is desirable to selectively sample specific subsets of the wideband feedback signal and hence reduce the bandwidth of the feedback signal and the required resolution in order to reduce the performance and resource requirements for the feedback circuit 40 and adaptation circuit 70.

The predistortion model of the power amplifier 36 may be considered a weak function of the bandwidth, whose coefficients change relatively slowly compared to the signal bandwidth. Therefore, it is not necessary to sample the entire contiguous bandwidth of interest in the feedback path. Rather, it is sufficient to sample selected portions of the feedback bandwidth corresponding to, and representative of, each nonlinear distortion term in order to adapt the coefficients of the predistortion model.

Figure 5:
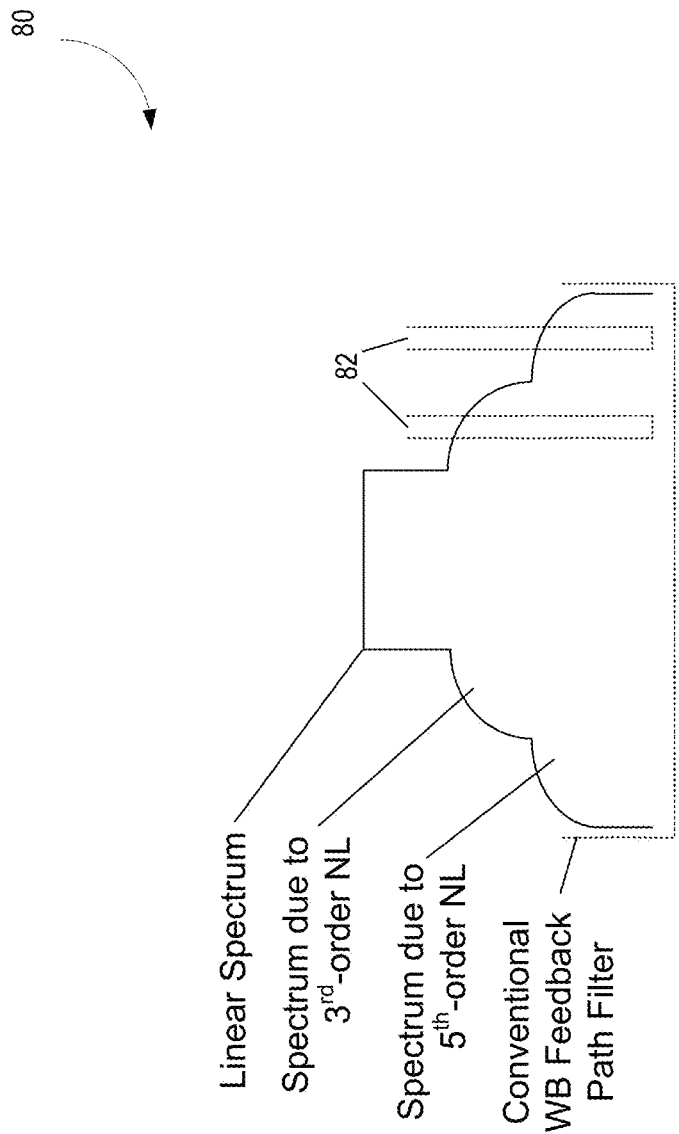
FIG. 5 schematically illustrates selective filters for the selective feedback circuit.

FIG. 5 illustrates selective sampling of the feedback signal as implemented in some embodiments of the invention. FIG. 5 illustrates the feedback signal spectrum 80 in the frequency domain. Imperfections in the predistortion process will result in residual distortion present in the power amplifier output signal. Examined in the frequency-domain, the non-linear odd-order terms produce distortion spectra whose bandwidth is proportional to the order. For example, the 3rd-order distortion spectrum which is due entirely to the 3rd order term has a spectrum three times the bandwidth of the linear input spectrum, the 5th order term has a spectrum five times the bandwidth of the linear input spectrum, and so forth. The significance of the distortion product typically diminishes for higher order terms.

The exemplary signal spectrum shown in FIG. 5 illustrates distortion components corresponding to 3rd order terms and 5th order terms in the predistortion model. In exemplary embodiments described herein, one or more narrowband filters are used to isolate the distortion components in the feedback signal to generate narrowband distortion signals 82 representative of the distortion components. Though the narrowband distortion signals have significantly reduced bandwidth compared to the feedback signal, the signals contain sufficient information to adapt the predistortion model. One advantage of this approach is that fewer processing resources are required, i.e. sampling rate and bit-resolution.

The instantaneous dynamic range of the narrowband signals 82 and hence bit-resolution adequate to represent the narrowband signal is significantly reduced compared to the wideband feedback signal $V_f$. The reduction in processing resources translate into lower complexity and lower cost implementations.

Figure 6:
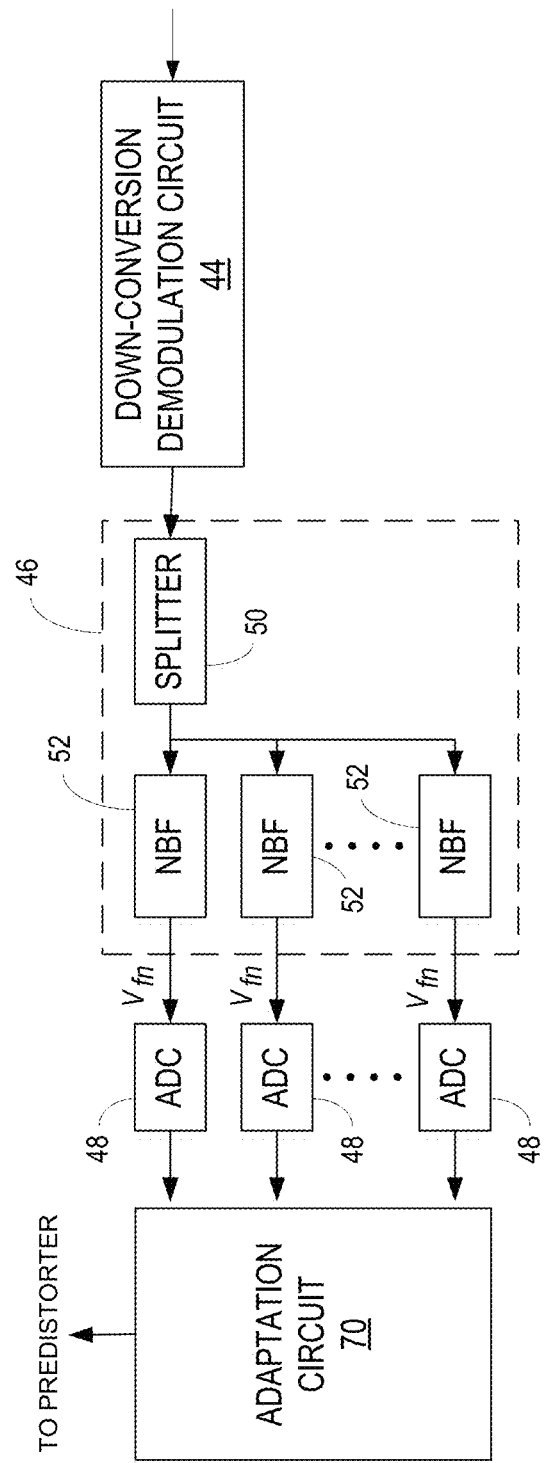
FIG. 6 illustrates a selective feedback circuit with parallel filters for the transmitter of FIG. 4.

FIG. 6 illustrates an exemplary filter circuit 46 according to one embodiment of the invention. As shown in FIG. 6, the feedback signal output by the down-conversion/demodulation circuit 44 is input to the filter circuit 46. The filter circuit includes a splitter 50 to divide the feedback signal $V_f$ and a plurality of narrowband filters 52 arranged in parallel. Each narrowband filter 52 is configured to take a narrow slice of the output signal spectrum to isolate a distortion component considered significant to generate a narrowband distortion signal $V_{fn}$. The narrowband distortion signals $V_{fn}$ are converted from analog-to-digital form by respective analog-to-digital converters 48 and input to the adaptation circuit 70. Because the bandwidth of the narrowband distortion signals is significantly reduced compared to the feedback signal $V_f$, analog-to-digital converters 48 with lower operational bandwidth (and thus lower sampling rate) can be used.

Figure 7:
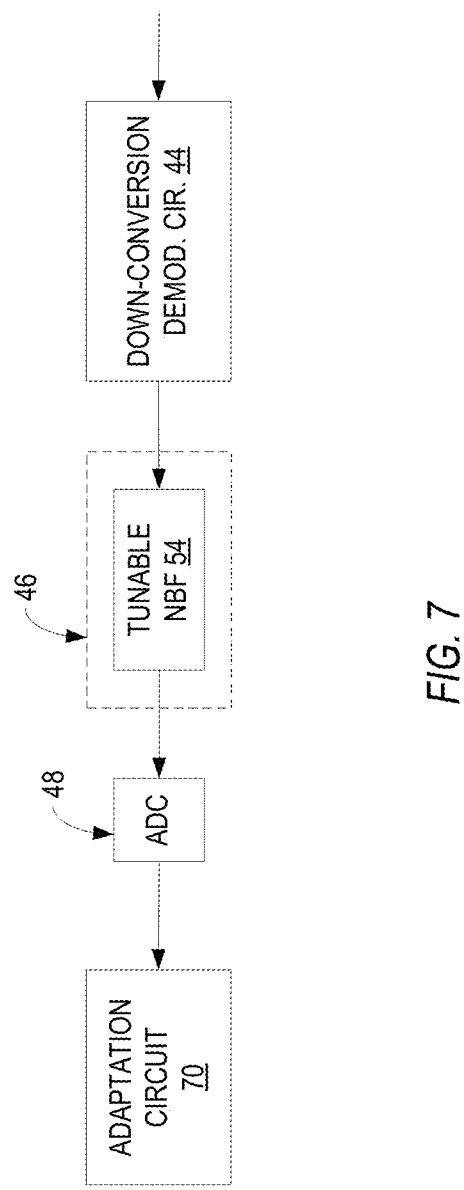
FIG. 7 illustrates a selective feedback circuit with a tunable filter for the transmitter of FIG. 4.

FIG. 7 illustrates an alternate embodiment of the filter circuit 46. In this embodiment, the filter circuit comprises a tunable, narrowband filter 54. The feedback signal $V_f$ output by the down-conversion/demodulation circuit 42 is input to the tunable filter 54. The tunable filter 54 comprises an agile filter that can be tuned to different frequencies within the frequency band of interest. The tunable filter 54 is used to isolate different ones of the distortion components in different time intervals. The distortion signal output by the tunable filter 54 is then converted by an analog-to-digital converter 48 and input to the adaptation circuit 70.

In some embodiments of the inventions, a controller 90 may be provided to control the amount of resources used to feedback and process different distortion signals. In the embodiment shown in FIG. 7, the controller 90 can determine the update rate needed for each feedback signal and allocate time slots to different distortion signals. For example, the tunable narrowband filter 54 can be controlled to repeatedly sample each of the distortion components in sequence. In some embodiments of the invention, the tunable narrowband filter 54 can be controlled to capture an equal update rate for each distortion component during an update interval for the adaptation circuit 70. In other embodiments of the invention, the tunable narrowband filter 54 can be controlled to capture an unequal update rate for different distortion components. In general, the tunable narrowband filter 54 may be controlled to assign a higher update rate (relatively more time slots) for distortion components having greater significance, and assign a lower update rate (fewer time slots) for distortion components having lesser significance. The controller 90 may also allocate more of its processing resources of the adaptation circuit 70 to the processing of samples for the distortion components considered most significant.

In the embodiment shown in FIGS. 6 and 7, the center frequency of the feedback filters 52 or tunable narrowband filter 54 should be chosen to minimize interference from signal components having a higher signal level. For example, the center frequency of filter 52 for the 3rd order distortion component should be selected to optimize rejection of the (higher magnitude) linear component of the feedback signal $V_f$. Similarly, the filter for the 5th order distortion component should be positioned to optimize rejection of the linear and 3rd order distortion components.

Figure 8:
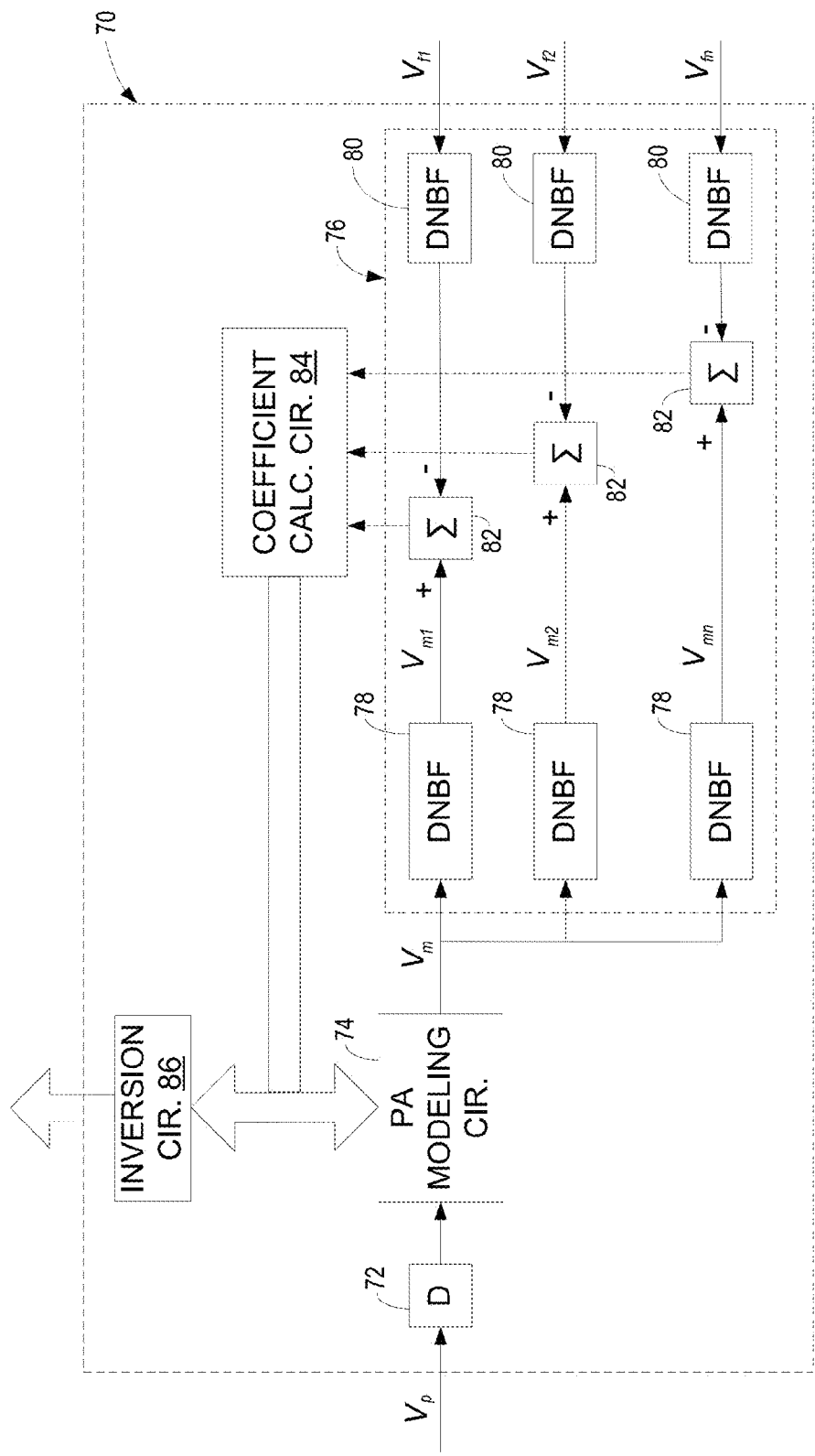
FIG. 8 illustrates an adaptation circuit with parallel filters for the transmitter of FIG. 4.

Referring now to FIG. 8, an exemplary adaptation circuit 70 is shown. The adaptation circuit 70 comprises a delay circuit 72, power amplifier modeling circuit 74, comparison circuit 76, coefficient calculation circuit 84, and inversion circuit 86. Delays, in general, are applied throughout circuit 70 in order to compensate for unequal filtering delays. Digital filter delays are deterministic and known by design. The power amplifier modeling circuit 74 models the distortion function of the power amplifier 36. The predistortion model in one exemplary embodiment comprises a mathematical expression comprising a sequence of odd-order terms and corresponding coefficients. The coefficients of the odd-order terms are changed in order to adapt the predistortion model.

The predistorted signal $V_p$ output by the predistorter 60 is input to the delay circuit 72, and then to the power amplifier modeling circuit 74. The delay circuit 72 delays the predistorted signal $V_p$ by an amount equal to the combined delay of the transmit circuit 30 and feedback circuit 40. The power amplifier modeling circuit 74 generates a modeled version of the power amplifier output signal, denoted $V_m$. If the model of the distortion function for the power amplifier 36 is accurate, the modeled output signal $V_m$ and the real output signal $V_o$ would be the same.

The modeled output signal $V_m$ is input along with the distortion signals $V_{fn}$ to the comparison circuit 76. The purpose of the comparison circuit 76 is to compare the modeled output signal $V_m$ to the real output signal $V_o$ and to generate error signals representing the differences between the two signals. In order to perform the comparison, the modeled output signal $V_m$ is decomposed by digital narrowband filter 78 into component signals $V_{m1}, \ldots, V_{mn}$ that correspond to the distortion signals $V_{f1}, \ldots, V_{fn}$. Thus, the center frequency and bandwidth of each of the component signals $V_{mn}$ corresponds to one of the narrowband distortion signals $V_{fn}$. In some embodiments of the invention, the feedback signals $V_{f1}$ through $V_{fn}$ may also be filtered by digital narrowband filters 80 improve the quality of the feedback signals, but this is not strictly required.

The filtered components signals $V_{fn}$ and the filtered distortion signals $V_{mn}$ are input to a series of comparators 82. The comparators 82 compare the respective component signals to corresponding distortion signals $V_{mn}$ and generate error signals. The error signals output by the comparator 82 are input to the coefficient calculation circuit 84. Based on the error signals, the coefficient calculation circuit 84 updates the coefficients of the predistortion model used by the power amplifier modeling circuit 74 and the inversion circuit 86. The inversion circuit 86 computes corresponding coefficients for the inverse function used by the predistorter 60.

Figure 9:
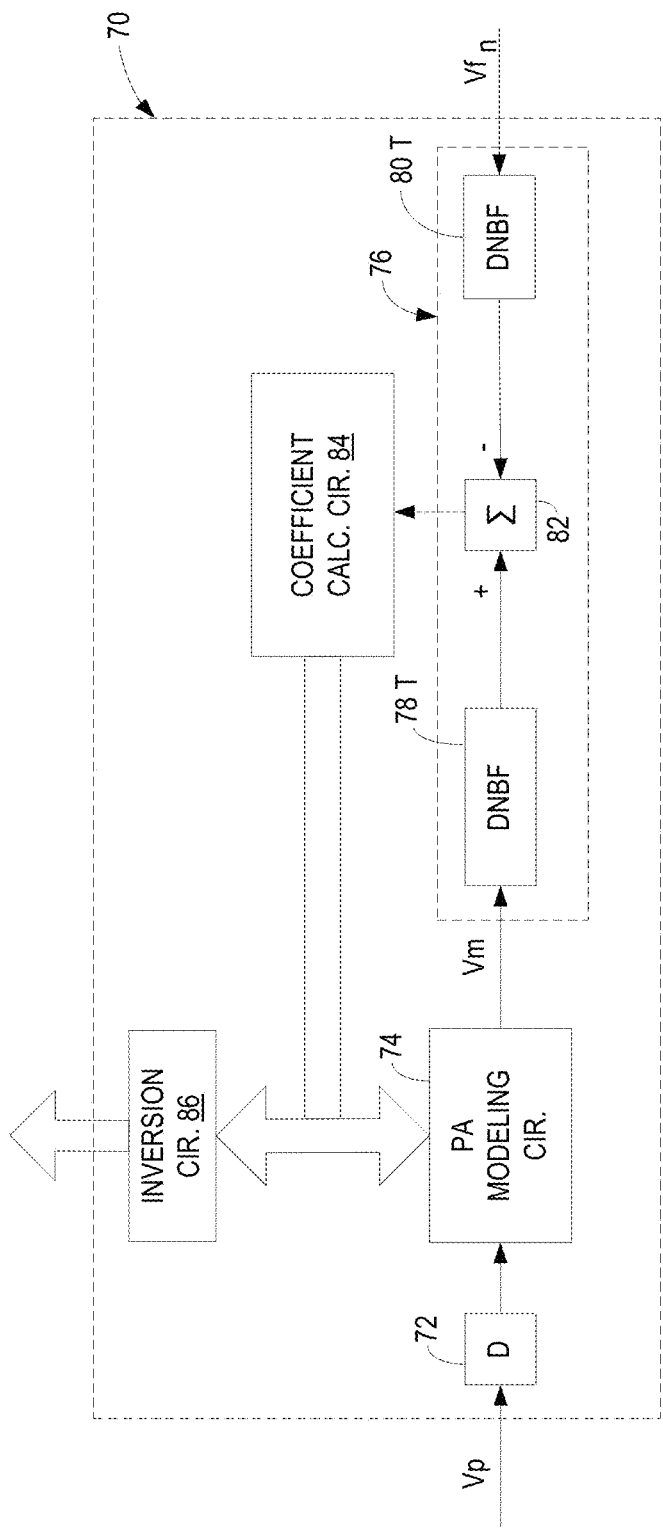
FIG. 9 illustrates another adaptation circuit with a tunable filter for the transmitter of FIG. 4.

FIG. 9 illustrates another exemplary embodiment of the adaptation circuit 70. The adaptation circuit shown in FIG. 9 is the same as previously described with the following differences. First, the individual narrowband filters 78 for generating the component signals $V_{mn}$ are replaced by a single tunable filter 78T. Similarly, the individual narrowband filters 80 for filtering the distortion signals $V_{fn}$ are replaced by a single tunable filter 80T. The narrowband filters 78T and 80T comprise agile filters that can be tuned to any frequency within the frequency band of interest. In this embodiment, the comparison circuit 76 may be controlled so that different ones of the distortion signals $V_{fn}$ are compared with the corresponding component signals $V_{mn}$ in different time intervals.

As previously noted, equal resources can be used for processing each of the component signals. Alternatively, more resources may be allocated for processing the distortion signals $V_{fn}$ that are considered most significant. The controller 90 may determine the amount of processing resources allocated to each distortion signal based on the relative significance of each distortion component.

Figure 10:
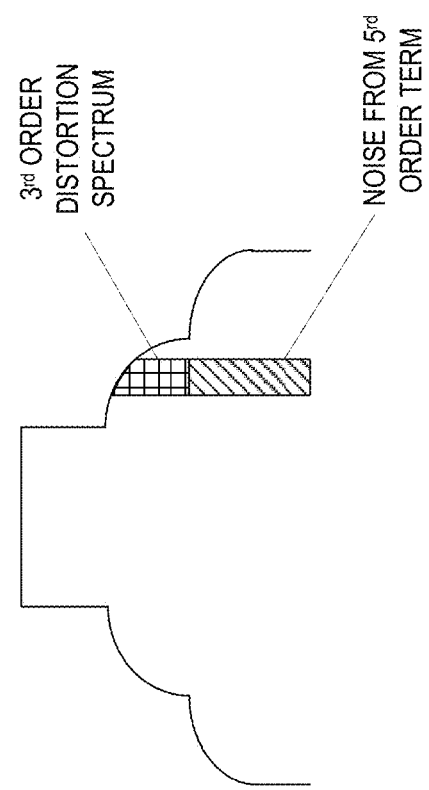
FIG. 10 schematically illustrates iterative processing by the selective filters.

In some embodiments of the invention, the distortion signals $V_{fn}$ may be processed progressively by the adaptation circuit 70 with the higher order distortion components processed before lower order distortion components. The reason for this approach is that the lower order distortion signals $V_{fn}$ contain noise attributable to the higher order distortion components. If the higher order distortion components are modeled first, they can be subtracted from the lower order terms in order to reduce the noise in the lower order terms as shown in FIG. 10.

In some embodiments of the invention, selective sampling of the feedback signal $V_f$ may be used to isolate distortion components even though the distortion components are not included in the predistortion model, because such terms are not considered significant. In general, the signal level of higher order terms, e.g., 7th order and 9th order, will not be significant and therefore not accounted for in the predistortion model. Nevertheless, it may be beneficial to monitor the signal level of these higher order terms. If the signal level of these higher order terms exceeds a threshold action can be taken, for example the output power of the power amplifier 36 can be reduced to avoid violation of linearity requirements.

In some embodiments of the invention, the selective sampling techniques as disclosed herein may be used to support non-contiguous operational bands with a single wideband power amplifier 36. Such an arrangement may be useful, for example, in a multi-carrier system. In such cases, the frequency separation between the signals of interest may be very large. Thus, the output of the power amplifier 36 will have a very wide frequency spectrum. The selective sampling techniques as described herein can be used to isolate the spectrum immediately surrounding the operational bands of interest adjacent each of the separated carriers. A small frequency band surrounding each carrier will contain the distortion components of interest. Distortion components within the separation band between the carriers of interest will not be significant and can be removed by analog filtering of the circuit output signal.

Figure 11:
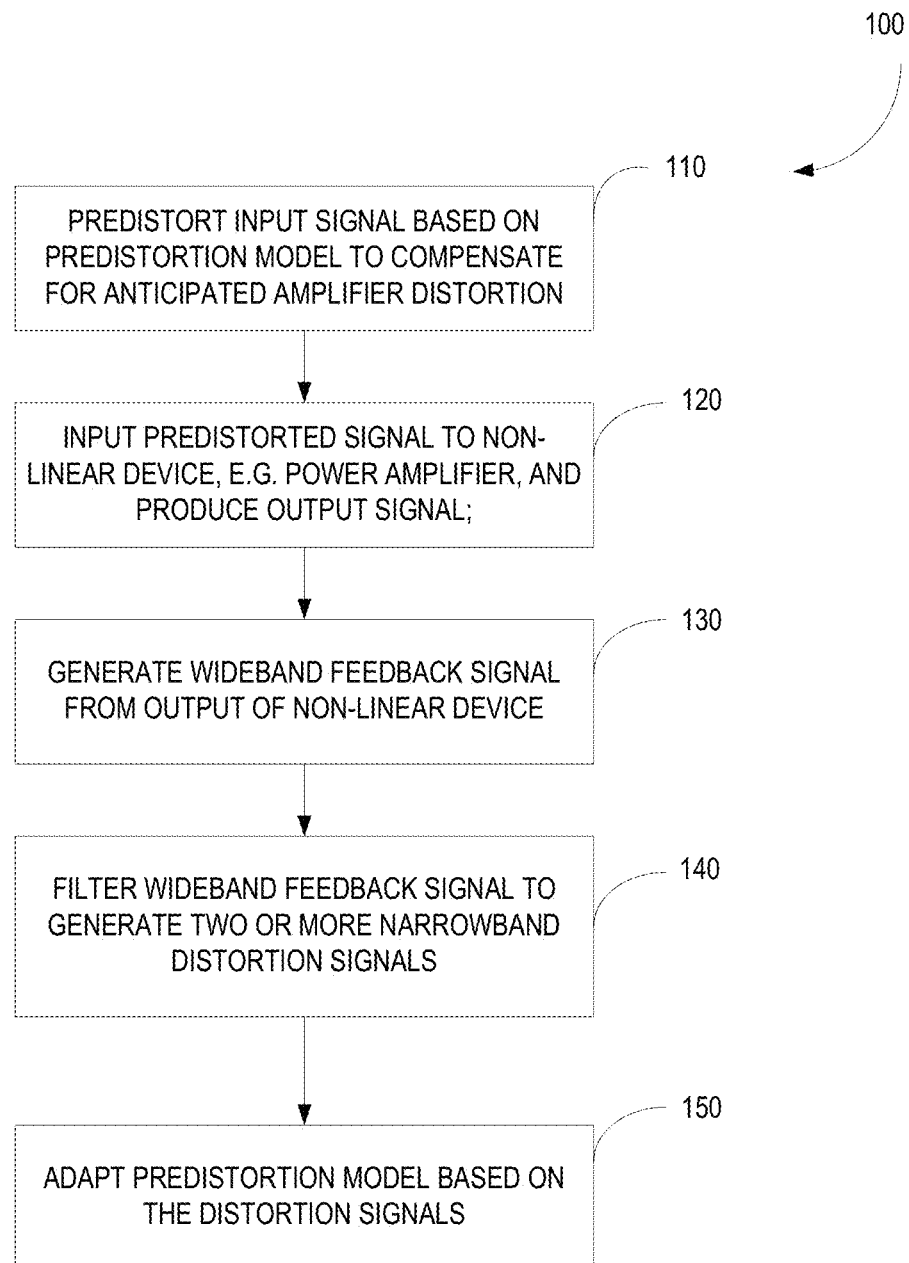
FIG. 11 illustrates an exemplary method of providing selective feedback according to the present invention

Referring to FIG. 11, an exemplary method according to one embodiment of the present invention is shown. The method 100 comprises predistorting an input signal based on a predistortion model to compensate for anticipated distortion introduced by a nonlinear device, such as a power amplifier (block 110). The predistorted signal is input to the nonlinear device, such as a power amplifier 36 (block 120). Due to the predistortion, the output signal of the nonlinear device should reduce the magnitude of distortion components. A wideband feedback signal is generated from the output signal of the nonlinear device (block 130). The wideband feedback signal is filtered to generate two or more narrowband distortion signals with predetermined frequencies corresponding to anticipated distortion components in the output signal (block 140). As previously described, the distortion signals represent the residual distortion in the output signal from the nonlinear device. Model parameters for the predistortion model of the nonlinear device are then adapted based on the distortion signals (block 150). By filtering the wideband feedback signal to generate narrowband distortion signals, the bandwidth and resolution requirements for signal processing in the feedback path is significantly reduced. Further, cost and complexity of the processing circuits to process the feedback signal are reduced, resulting in simpler and more cost-efficient predistorter implementations.

The present invention may, of course, be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A method of predistorting an input signal to a non-linear device to linearize an output signal, said method comprising:
   predistorting the input signal based on a predistortion model to compensate for distortion introduced by a non-linear device;
   inputting the predistorted signal into the non-linear device and producing an output signal as a function of the predistorted input signal;
   generating a wideband feedback signal from the output signal of the non-linear device;
   filtering the wideband feedback signal to generate two or more narrowband distortion signals, each distortion signal comprising a different sub-band of the wideband feedback signal with a predetermined frequency corresponding to an anticipated distortion components in the output signal; and
   adapting model parameters of the predistortion model based on the narrowband distortion signals.

2. The method of clam 1 wherein filtering the wideband feedback signal comprises filtering the wideband feedback signal in two or more narrowband filters arranged in parallel to produce the narrowband distortion signals.

3. The method of claim 2 wherein the narrowband filters have a fixed pass-band.

4. The method of claim 1 wherein filtering the wideband feedback signal comprises filtering the wideband feedback signal with a tunable filter in different time slots to produce different narrowband distortion signals in different time slots.

5. The method of claim 4 wherein filtering the wideband feedback signal with a tunable filter in different time slots comprises:
   tuning the filter to a first one of the predetermined frequencies in a first time slot;
   filtering the wideband feedback signal during the first time slot to generate a first narrowband distortion signal;
   tuning the filter to a second one of the predetermined frequencies in a second time slot; and
   filtering the wideband feedback signal during the second time slot to generate a second narrowband distortion signal.

6. The method of claim 1 further comprising adjusting the frequencies of the narrowband distortion signals to reduce spectra of distortion signals with higher signal levels from other distortion signals with lower signal levels.

7. The method of claim 1 wherein adapting model parameters of the predistortion model based on the narrowband distortion signals comprises:
   modeling a higher order distortion component based on the corresponding narrowband distortion signal; and
   subtracting the modeled higher order distortion component from the wideband feedback signal to cancel noise attributable to the higher order distortion signal.

8. The method of claim 1 further comprising allocating processing resources for adapting model parameters of the predistortion model to different narrowband distortion signals depending on an attribute of the corresponding distortion components.

9. The method of claim 8 wherein allocating processing resources for adapting model parameters of the predistortion model to different narrowband distortion signals comprises allocating resources to the narrowband distortion signals based on the order of the corresponding distortion components.

10. The method of claim 1 wherein the non-linear device comprises a power amplifier.

11. The method of claim 10 further comprising adapting an output power level of said power amplifier as a function of one or more of the narrowband distortion signals.

12. The method of claim 1 wherein the input signal comprises a multi-carrier signal having two or more non-contiguous carriers, and wherein filtering the wideband feedback signal comprises filtering the wideband feedback signal to generate narrowband distortion signals corresponding to each carrier.

13. A circuit comprising:
   a non-linear device configured to produce an output signal as a function of an input signal;
   a predistorter to predistort the input signal to the non-linear device based on a predistortion model of the non-linear device to compensate for distortion introduced by the non-linear device;
   a filter circuit configured to filter a wideband feedback signal derived from the output signal to generate two or more narrowband distortion signals, each distortion signal comprising a different sub-band of the wideband feedback signal with a
   predetermined frequency corresponding to an anticipated distortion components in the output signal; and
   an adaptation circuit configured to adapt model parameters of the predistortion model based on the narrowband distortion signals.

14. The circuit of clam 13 wherein the filter circuit comprises two or more narrowband filters in parallel to produce the narrowband distortion signals.

15. The circuit of claim 14 wherein the narrowband filters have a fixed pass-band.

16. The circuit of clam 13 wherein the filter circuit comprises a tunable filter and a filter control circuit configured to tune the tunable filter to pass different frequencies in different time slots.

17. The circuit of claim 16 wherein the filter control circuit is configured to:
   tune the filter to a first one of the predetermined frequencies in a first time slot;
   filter the wideband feedback signal during the first time slot to generate a first narrowband distortion signal;
   tune the filter to a second one of the predetermined frequencies in a second time slot; and
   filter the wideband feedback signal during the second time slot to generate a second narrowband distortion signal.

18. The circuit of claim 13 further comprising a control circuit configured to adjust the frequencies of the narrowband distortion signals to reduce spectra of distortion signals with higher signal levels from other distortion signals with lower signal levels.

19. The circuit of claim 18 wherein the adaptation circuit is configured to:
   model the higher order distortion component based on the corresponding distortion signal; and
   subtract the modeled higher order distortion component from the wideband feedback signal to cancel noise attributable to the higher order distortion signal.

20. The circuit of claim 13 wherein the adaptation circuit is further configured to allocate processing resources for adapting model parameters of the predistortion model to different distortion signals depending on an attribute of the corresponding distortion components.

21. The circuit of claim 20 further comprising a controller configured to allocate resources to different narrowband distortion signals based on the order of the corresponding distortion components.

22. The circuit of claim 13 wherein the non-linear device comprises a power amplifier.

23. The circuit of claim 22 wherein the adaptation circuit is configured to adapt an output power level of said power amplifier as a function of one or more of the narrowband distortion signals.

24. The circuit of claim 13 wherein the input signal comprises a multi-carrier signal having two or more non-contiguous carriers, and wherein the filter circuit comprises filters configured to filter the wideband feedback signal to generate narrowband distortion signals corresponding to each carrier.

* * * * *

UNITED STATES PATENT AND TRADEMARK OFFICE
CERTIFICATE OF CORRECTION

| | | |
|---|---|---|
| PATENT NO. | : 8,536,943 B2 | Page 1 of 1 |
| APPLICATION NO. | : 13/365782 | |
| DATED | : September 17, 2013 | |
| INVENTOR(S) | : Irvine | |

It is certified that error appears in the above-identified patent and that said Letters Patent is hereby corrected as shown below:

In the Claims:

In Column 9, Line 19, in Claim 1, delete "components" and insert -- component --, therefor.

In Column 10, Line 26, in Claim 13, delete "components" and insert -- component --, therefor.

Signed and Sealed this
Fifteenth Day of July, 2014

Michelle K. Lee
*Deputy Director of the United States Patent and Trademark Office*